United States Patent
Bessho

(10) Patent No.: US 7,313,015 B2
(45) Date of Patent: Dec. 25, 2007

(54) STORAGE ELEMENT AND MEMORY INCLUDING A STORAGE LAYER A MAGNETIZATION FIXED LAYER AND A DRIVE LAYER

(75) Inventor: Kazuhiro Bessho, Kanagawa (JP)

(73) Assignee: Sony Corporation, Tokyo (JP)

( * ) Notice: Subject to any disclaimer, the term of this patent is extended or adjusted under 35 U.S.C. 154(b) by 41 days.

(21) Appl. No.: 11/241,315

(22) Filed: Sep. 30, 2005

(65) Prior Publication Data

US 2006/0092696 A1    May 4, 2006

(30) Foreign Application Priority Data

Nov. 1, 2004    (JP)    ............ P2004-318464

(51) Int. Cl.
*G11C 11/00* (2006.01)
(52) U.S. Cl. .................................. 365/158; 365/173
(58) Field of Classification Search ............. 365/158, 365/173
See application file for complete search history.

(56) References Cited

U.S. PATENT DOCUMENTS 6,714,390 B2 *  3/2004  Terada et al. .......... 360/324.12
6,828,785 B2 * 12/2004  Hosomi et al. ............ 324/252
6,979,500 B2 * 12/2005  Hasegawa et al. ....... 428/811.2

FOREIGN PATENT DOCUMENTS

JP    2003-17782    1/2003

OTHER PUBLICATIONS

Nikkei Electronics, Feb. 12, 2001, pp. 164-171.
J.NaHas et al., IEEE/ISSCC 2004 Visulas Supplement, p. 22.

* cited by examiner

*Primary Examiner*—Hoai V. Ho
(74) *Attorney, Agent, or Firm*—Sonnenschein Nath & Rosenthal LLP

(57) ABSTRACT

A memory includes a storage element (10) composed of a storage layer (5) for holding information with the magnetization state of a magnetic material, a magnetization fixed layer (3) provided relative to the storage layer (5) through an intermediate layer (4), the magnetization of the storage layer (5) being changed with application of an electric current to the laminated layer direction to record information on the storage layer (5) and a drive layer (7) provided relative to the storage layer (5) through a nonmagnetic layer (6), the magnetic direction thereof being substantially fixed to the laminated layer direction and an electric current supplying means for applying an electric current to the storage element (10) along the laminated layer direction, wherein contents of information to be recorded are changed during a time period in which an electric current is supplied from the electric current supplying means to the storage element (10).

5 Claims, 9 Drawing Sheets

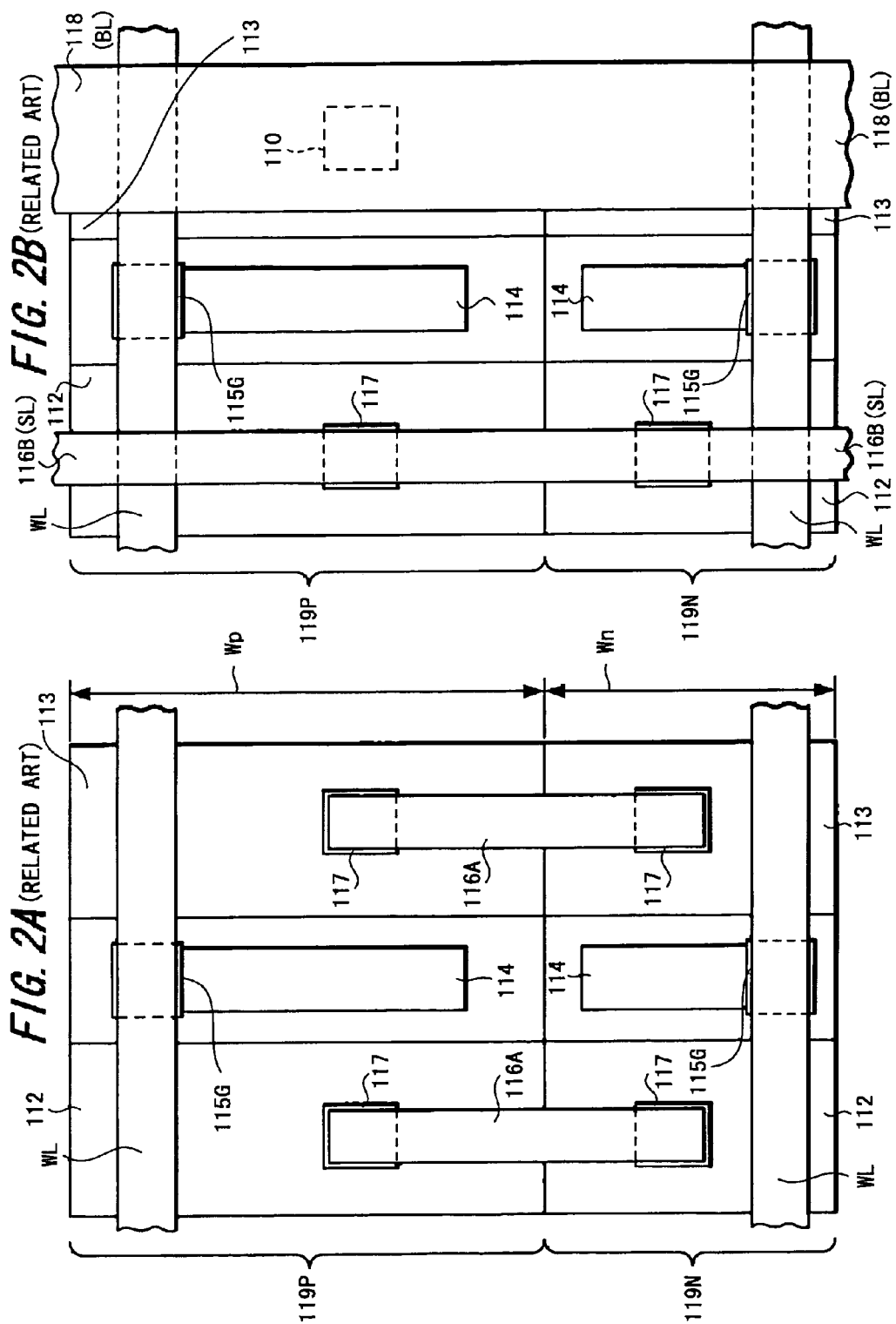

STORAGE ELEMENT AND MEMORY INCLUDING A STORAGE LAYER A MAGNETIZATION FIXED LAYER AND A DRIVE LAYER

CROSS REFERENCES TO RELATED APPLICATIONS

The present invention contains subject matter related to Japanese Patent Application JP 2004-318464 filed in the Japanese Patent Office on Nov. 1, 2004, the entire contents of which being incorporated herein by reference.

BACKGROUND OF THE INVENTION

1. Field of the Invention

The present invention relates to a storage element composed of a storage layer for storing therein the magnetization state of a ferromagnetic layer as information and a magnetization fixed layer of which magnetization direction is fixed and in which the magnetization direction of the storage layer is changed with application of an electric current and a memory including this storage element. More particularly, this invention relates to a memory suitable for use as a nonvolatile memory.

2. Description of the Related Art

As information communication equipment, in particular, personal small information equipment such as personal digital assistants is widespread rapidly, it is requested that devices such as memory and logic constructing personal small information equipment should become higher in performance in such a way as to become higher in integration degree, to become higher in operation speed and to become smaller in power consumption.

In particular, technologies to make semiconductor non-volatile memories become higher in speed and larger in storage capacity become more important as complementary technologies to a magnetic hard disk which has been so far essentially difficult to be miniaturized, to become higher in speed and to become lower in power consumption due to the presence of movable parts and the like. Also, the above-mentioned technologies to realize the above-mentioned high-speed and large-capacity semiconductor nonvolatile memory become more important in order to realize new functions such as a so-called "instant on" by which an operation system can get started as the same time it is energized.

A semiconductor flash memory and an FeRAM (ferroelectric nonvolatile memory) and the like are now commercially available as the nonvolatile memory, and such nonvolatile memories are now under active research and development in order to make nonvolatile memories become higher in performance.

In recent years, as a new nonvolatile memory using a magnetic material, a MRAM (magnetic random-access memory) using a tunnel magnetoresistive effect has been developed and advanced so far remarkably and it now receives a remarkable attention (see Cited Non-Patent References 1 and 2, for example).

This MRAM has a structure in which very small magnetic memory devices to record information are located regularly, wirings, for example, word lines and bit lines being provided to access these magnetic memory devices.

Each magnetic memory device includes a storage layer to record information as the magnetization direction of a ferromagnetic material.

Then, as the arrangement of the magnetic memory device, there is employed a structure using a so-called magnetic tunnel junction (MTJ: magnetic tunnel junction) composed of the above-mentioned storage layer, a tunnel insulating layer (nonmagnetic spacer film) and a magnetization fixed layer whose magnetization direction is fixed. The magnetization direction of the magnetization fixed layer can be fixed by providing an antiferromagnetic layer, for example.

Since this structure generates a so-called tunnel magnetoresistive effect in which a resistance value relative to a tunnel electric current flowing through the tunnel insulating film changes in response to an angle formed between the magnetization direction of the storage layer and the magnetization direction of the magnetization fixed layer, it is possible to write (record) information by using this tunnel magnetoresistive effect. The magnitude of this resistance value becomes the maximum value when the magnetization direction of the storage layer and the magnetization direction of the magnetization fixed layer are anti-parallel to each other and it becomes the minimum value when they are parallel to each other.

According to the magnetic memory device having the above-mentioned arrangement, information can be written (recorded) on the magnetic memory device by controlling the magnetization direction of the storage layer of the magnetic memory device with application of a synthesized electric current magnetic field generated when an electric current flows through both of the word line and the bit line. It is customary to store a difference between the resultant magnetization directions (magnetized states) of the storage layer in response to "0" information or "1" information.

When on the other hand recorded information is read out from the magnetic memory device, a memory cell is selected by using a device such as a transistor and a difference between the magnetization directions of the storage layer is detected as a difference between voltage signals by using the tunnel magnetoresistive effect of the magnetic memory device, whereby recorded information can be detected.

Having compared this MRAM with other nonvolatile memories, it is to be understood that the maximum merit of the MRAM is that, since "0" information and "1" information are rewritten by inverting the magnetization direction of the storage layer formed of the ferromagnetic material, the MRAM can be rewritten as a high speed nearly infinitely ($>10^{15}$ times).

However, the MRAM has to generate a relatively large electric current magnetic field to rewrite recorded information and hence an electric current of a certain large magnitude (for example, about several milliamperes (mA)) should flow through the address wirings. Therefore, it is unavoidable that power consumption of the MRAM is increased considerably.

Also, the MRAM needs write address wiring and read address wiring and hence it has been difficult to microminiaturize a memory cell from a structure standpoint.

Further, as the device is microminiaturized increasingly, the address wiring also is reduced in width so that it becomes difficult to apply a sufficient electric current to the address wiring. In addition, since coercive force of the device is increased, a necessary electric current magnetic field is increased and hence power consumption of the device is increased.

Accordingly, it has been difficult to microminiaturize the device.

For this reason, a memory having an arrangement to use magnetization inversion generated by spin transfer receives a remarkable attention as an arrangement capable of inverting the magnetization direction with application of a small electric current.

Magnetization inversion generated by spin transfer is to cause magnetization inversion to occur in other magnetic material by injecting spin-polarized electrons from the magnetic material to other magnetic material (see Cited Patent Reference 1, for example).

Specifically, magnetization inversion generated by spin transfer is a phenomenon to give torque to the magnetization of this magnetic layer when spin-polarized electrons passed through the magnetic layer (magnetization fixed layer) of which magnetization direction is fixed enter other magnetic layer (magnetization free layer) whose magnetization direction is not fixed. Then, the magnetization direction of the magnetic layer (magnetization free layer) can be inverted with application of an electric current of a magnitude higher than a certain threshold value.

For example, when application of an electric current to a giant magnetoresistive effect device (GMR device) or a magnetic tunnel junction device (MTJ device) including a magnetization fixed layer and a magnetization free layer in the direction perpendicular to the film plane thereof, the magnetization direction of at least a part of the magnetic layer of these devices can be inverted.

Thus, when the storage element including the magnetization fixed layer and the magnetization free layer (storage layer) is constructed and a polarity of an electric current flowing through the storage element is changed, the magnetization direction of the storage layer is inverted to rewrite "0" information and "1" information.

When recorded information is read out from the memory, recorded information can be read out from the memory by using the tunnel magnetoresistive effect similarly to the MRAM because this memory has the arrangement in which the tunnel insulating layer is provided between the magnetization fixed layer and the magnetization free layer (storage layer).

Then, magnetization inversion based on spin transfer has an advantage in that magnetization inversion can be realized without increasing an electric current even when the device is microminiaturized.

An absolute value of an electric current flowing through the storage element to invert the magnetization direction is less than 1 mA in a storage element of the scale of approximately 0.1 μm, for example. In addition, the above-mentioned absolute value is decreased in proportion to a volume of a storage element, which is advantageous from a scaling standpoint.

In addition, since the recording word line, which has been required by the MRAM, becomes unnecessary, this memory has an advantage in that the arrangement of the memory cell can be simplified.

[Cited Non-Patent Reference 1]: NIKKEI ELECTRONICS, 2001, VOL. 2. 12 (pp. 164 to 171)

[Cited Non-Patent Reference 2]: J. Nahas et al., IEEE/ISSC 2004 Visulas Supplement, p. 22

[Cited Patent Reference 1]: Official Gazette of Japanese laid-open patent application No. 2003-17782

FIG. 1 of the accompanying drawings is a schematic cross-sectional view showing an arrangement of a storage element capable of recording information by using spin transfer according to the related art.

As shown in FIG. 1, this storage element 110 is composed of an underlayer 101, an antiferromagnetic layer 102, a magnetization fixed layer 103, a nonmagnetic layer 104, a storage layer 105 and a capping layer 106 laminated with each other, in that order, from the lower layer.

The storage layer 105 is made of a ferromagnetic material having uniaxial magnetic anisotropy and the storage element 110 is able to store information therein depending on the magnetization state of this storage layer 105, that is, the direction of a magnetization M112 of the storage layer 105.

The magnetization fixed layer 103 made of a ferromagnetic material and of which direction of a magnetization M111 is fixed is provided through the nonmagnetic layer 104 to the storage layer 105. In the arrangement shown in FIG. 1, since the antiferromagnetic layer 102 is formed on the lower layer of the magnetization fixed layer 103, the direction of the magnetization Mill of the magnetization fixed layer 103 is fixed by the action of this antiferromagnetic layer 102.

When information is written in this storage element 110, the direction of the magnetization M112 of the storage layer 105 is inverted based on spin transfer with application of an electric current flowing through the direction perpendicular to the film plane of the storage layer 105, that is, the lamination layer direction of the storage element 110.

Magnetization inversion based on spin transfer will be described in brief.

Electrons have two kinds of spin angular momentums. Let it be assumed that the two kinds of spin angular momentums are defined as upward spin angular momentum and downward spin angular momentum. Both of the upward spin angular momentums and the downward spin angular momentums are of the same number within the nonmagnetic material but they are different in number within the ferromagnetic material.

In the storage element 110 shown in FIG. 1, let it be considered the case in which the directions of the magnetic moments are anti-parallel to each other in the magnetization fixed layer 103 and the storage layer 105 and in which electrons are to be transferred from the magnetization fixed layer 103 to the storage layer 105.

Electrons passed through the magnetization fixed layer 103 are spin-polarized so that the upward spin angular momentums and the downward spin angular momentum are different from each other in number.

If electrons reach the other magnetic material before the thickness of the nonmagnetic layer 104 is sufficiently thin so that spin polarization is relaxed and electrons are placed in the non-polarized state (upward spin angular momentum and downward spin angular momentum are the same in number) of the ordinary nonmagnetic material, then since the directions of the magnetic moments of the magnetization fixed layer 103 and the storage layer 105 are anti-parallel to each other and signs of degree of spin polarization are opposite to each other, a part of electrons is inverted, the direction of the spin angular momentum is changed in order to decrease energy of the system. At that time, since a total angular momentum of the system should be preserved, reaction equivalent to the total of angular momentums changed by electrons of which directions are changed is given to the magnetic moment of the storage layer 105.

When there are few electric currents, that is, electrons passed at the unit time, there are a small total number of electrons whose directions are to be changed so that the change of the angular momentum generated in the magnetic moment of the storage layer 105 is small. However, when an electric current is increased, many changes of the angular momentums can be given to the electrons within the unit time. The time change of the angular momentum is torque. When torque exceeds a threshold value, the magnetic moment M112 of the storage layer 105 starts to be inverted and it is stabilized after it was rotated 180 degrees owing to its uniaxial magnetic anisotropy. That is, the magnetic moment is inverted from the anti-parallel state to the parallel state.

On the other hand, when the directions of the magnetic moments are parallel to each other in the magnetization fixed layer 103 and the storage layer 105, if an electric current flows through the direction to transfer electrons from the storage layer 105 to the magnetization fixed layer 103, then torque is applied to the magnetization fixed layer 103 and the storage layer 105 when electrons spin-inverted after they were reflected on the magnetization fixed layer 103 enter the storage layer 105 with the result that the magnetic moments can be inverted from the parallel state into the anti-parallel state.

However, an amount of an electric current required to invert the magnetic moments from the parallel state to the anti-parallel state is increased more as compared with that required when the magnetic moments are inverted from the anti-parallel state to the parallel state.

As described above, information ("0" information and "1" information) is recorded on the storage layer 105 with application of electric currents higher than a certain threshold value corresponding to the respective polarities in the direction from the magnetization fixed layer 103 to the storage layer 105 and vice versa.

Also, information can be read out from the storage layer 105 by using a resistance change dependent on a relative angle between the magnetic moments of the storage layer 105 and the magnetization fixed layer 103, that is, a so-called magnetoresistive effect in which the minimum resistance is obtained when the magnetic moments are parallel to each other and in which the maximum resistance is obtained when the magnetic moments are anti-parallel to each other. The magnetization direction of the magnetization fixed layer 103 becomes the standard of the magnetization direction of the storage layer 105 and hence the magnetization fixed layer 103 is referred to as a "reference layer".

Specifically, when a substantially constant voltage is applied to the storage element 110 and a magnitude of an electric current flowing at that time is detected, information can be read out from the storage layer 105.

In the following description, a relationship between the resistance state of the storage element 10 and information will be prescribed in such a manner that a low resistance state is presented as "1" information, a high resistance state being prescribed as "0" information, respectively.

Also, an electric current to transfer electrons from the capping layer 106 shown in FIG. 1 to the underlayer 101, that is, from the upper layer to the lower layer is prescribed as a positive polarity electric current. At that time, when a positive polarity electric current flows through the storage element 101, electrons are transferred from the capping layer 106 to the underlayer 101, that is, from the storage layer 105 to the magnetization fixed layer 103 so that the direction of the magnetization M111 of the magnetization fixed layer 103 and the direction of the magnetization M112 of the storage layer 105 are placed in the anti-parallel state, thereby resulting in the storage element 101 being set to the high resistance state as mentioned hereinbefore.

Accordingly, an electric current to write "1" information (low resistance state) becomes negative in polarity and an electric current to write "0" information (high resistance state) becomes positive in polarity.

If the memory is constructed by using the magnetization inversion based on the above-mentioned spin transfer, when information is written in the storage layer (when information is rewritten based on "0" information and "1" information), a polarity (positive polarity or negative polarity) of an electric current should be changed.

To this end, in order to select the memory cell, a memory cell is constructed by using a transfer gate consisting of a p-type transistor and an n-type transistor.

FIG. 2A is a plan view showing the portion of the layer lower than the interconnection layer of the first layer of one memory cell of the memory in which the memory cell is constructed by using the storage element 110 shown in FIG. 1. FIG. 2B is a top view thereof.

As shown in FIGS. 2A and 2B, an NMOS transistor 119N and a PMOS transistor 119P are electrically connected at their sources and drains through an interconnection layer 116A of a first layer, thereby resulting in a selection transistor being constructed.

Thus, a so-called transfer gate is composed of these NMOS transistor 119N and PMOS transistor 119P.

Then, by these transfer gates, the memory cell can be switched so that an electric current may flow through the storage element 110 and that an electric current may be inhibited from flowing through the storage element 110.

A gate electrode 114 of the PMOS transistor 119P is connected through a contact layer 115G to a word line WL formed of the interconnection layer 116A of the first layer. The gate electrode 114 of the NMOS transistor 119N is connected through the contact layer 115G to the word line WL. In response to ON and OFF of an electric current flowing through the storage element 110, a control signal is supplied to one of the word line WL of the PMOS transistor 119P side and the word line WL of the NMOS transistor 119N side and a control signal which results from supplying the same control signal to an inverter is supplied to the other of the above-mentioned two word lines WL.

In this memory cell, when a positive or negative potential difference is applied to the bit line BL and the sense line SL and a voltage is applied to the word line WL to turn the transfer gate ON, an electric current can flow through any one of the lamination directions of the storage element 110.

However, when the memory cell is constructed by using the transfer gate consisting of the two transistors 119N and 119P, it is unavoidable that its structure and its circuit become complicated as compared with other memory of so-called 1Tr type.

Also, since an extra space is required for each memory cell, it becomes difficult to make the memory become high in density and large in storage capacity.

SUMMARY OF THE INVENTION

In view of the aforesaid aspect, the present invention intends to provide a storage element and a memory which become able to record information without changing polarity of an electric current applied to the storage element so that the structures of the storage element and the memory can be simplified.

According to an aspect of the present invention, there is provided a storage element which is composed of a storage layer for holding information with the magnetization state of a magnetic material, a magnetization fixed layer provided relative to the storage layer through an intermediate layer, the magnetization of the storage layer being changed with application of an electric current to the laminated layer direction to record information on the storage layer and a drive layer provided relative to the storage layer through a nonmagnetic layer, the magnetic direction thereof being substantially fixed to the laminated layer direction.

According to another aspect of the present invention, there is provided a memory which is composed of a storage element composed of a storage layer for holding information with the magnetization state of a magnetic material, a magnetization fixed layer provided relative to the storage layer through an intermediate layer, the magnetization of the storage layer being changed with application of an electric current to the laminated layer direction to record information on the storage layer and a drive layer provided relative to the storage layer through a nonmagnetic layer, the magnetic direction thereof being substantially fixed to the laminated layer direction and electric current supplying means for applying an electric current to the storage element along the laminated layer direction, wherein contents of information to be recorded are changed a duration of time in which an electric current is supplied from the electric current supplying means to the storage element.

According to the above-mentioned arrangement of the storage element of the present invention, since the storage element includes the storage layer for storing therein information based on the magnetization state of the magnetic material, the magnetization fixed layer is provided on this storage layer through the intermediate layer and the magnetization direction of the storage layer is changed to record information on the storage layer with application of the electric current to the laminating layer direction, information can be recorded by spin transfer (spin injection) with application of the electric current to the laminating layer direction.

Also, since the drive layer of which magnetization direction is substantially fixed to the laminating layer direction on the storage layer through the non-magnetic layer, the magnetization direction of the drive layer lies in the laminating layer direction and hence it has a vertical magnetic anisotropy. As a result, when the electric current flows through the laminating layer direction of the storage element, owing to movement of polarized electrons between the drive layer and the storage layer (spin injection), force of the laminating layer direction is given to the magnetization vector of the storage layer so that precession motion is generated in the magnetization vector of the storage layer, thereby resulting in the magnetization direction being changed. Then, by a duration of time in which an electric current flows, it becomes possible to invert the magnetization direction from that obtained before the electric current flows or not to invert the magnetization direction (to make the magnetization direction become the same as that obtained before the electric current flows).

Accordingly, without changing the polarity of the electric current, it becomes possible to record "0" information and "1" information by changing a duration of time in which an electric current of the same polarity flows through the storage element.

According to the above-mentioned arrangement of the memory of the present invention, since the memory includes the storage element having the storage layer for storing therein information based on the magnetization state of the magnetic material and the electric current supplying means (electrodes, wirings, power supply, etc.) for supplying the electric current of the laminating layer direction to the storage element and the storage element has the arrangement of the storage element of the present invention, it is possible to record information based on spin transfer (spin injection) with application of the electric current to the laminating layer direction of the storage element through the electric current supplying means.

Also, since the memory has the arrangement in which contents of information to be recorded are changed depending on a duration of time in which the electric current flows from the electric current supplying means to the storage element, without changing the polarity of the electric current flowing from the electric current supplying means to the storage element, it is possible to record "0" information and "1" information by only the electric current of the same polarity.

Further, in the above-described storage element of the present invention, it is possible to modify the arrangement of the storage element in which the drive layer is composed of more than two layers of laminating layers, a layer made of a material having higher spin polarizability is located on the drive layer at its side opposing the storage layer and a layer made of a material having higher vertical magnetic anisotropy is provided on the drive layer at its side which does not oppose the storage layer.

According to this arrangement, efficiency of spin transfer (spin injection) can be improved by the layer (first layer) made of the material having the high spin polarizability on the side opposite to the storage layer and the magnetic moment of the first layer can be directed to the laminating layer direction of the storage element owing to mutual action between the layer (second layer) made of the material having the higher vertical magnetic anisotropy on the drive layer at its side, which does not oppose the storage layer, and the first layer provided on the drive layer at its side opposing the storage layer. Since the more than two layers composing the drive layer can play their own roles as described above, it becomes possible to increase a range in which materials of the drive layer are to be selected. Also, since the magnetization direction of the storage layer can easily be changed by using mutual action, it becomes possible to record information at a low electric current which may not be realized by a drive layer of a single layer.

According to the above-mentioned present invention, it becomes possible to record "0" information and "1" information on the storage layer of the storage element by changing a duration of time in which the electric current of the same polarity flows without changing the polarity of the electric current. Therefore, when each memory cell includes the selection transistor, it becomes sufficient to provide only one transistor through which an electric current of a polarity can flow in response to the polarity of the electric current flowing through the storage element.

As a result, since the selection transistor is composed of only the single transistor (for example, NMOS transistor), as compared with the memory in which the transfer gate consisting of the two transistors is constructed as the selection transistor, the arrangement of the memory cell can be simplified and also the size of the memory cell can be reduced.

Thus, it becomes possible to integrate storage elements at high density in the memory in which many memory cells composed of storage elements are constructed. That is, it becomes possible microminiaturize the memory and also it becomes possible to increase the storage capacity by increasing the density of the memory.

Therefore, according to the present invention, it is possible to realize the nonvolatile memory of high density.

BRIEF DESCRIPTION OF THE DRAWINGS

FIGS. 2A and 2B are diagrams showing a structure of a memory cell of a memory using spin transfer according to the related art, wherein FIG. 2A is a plan view showing layers under an interconnection layer of a first layer of a memory cell and FIG. 2B is a top view of the memory cell;

FIGS. 6A and 6B are diagrams showing motions of magnetic moment obtained with application of an electric current pulse when magnetic moment of the storage layer is directed in the right-hand side, wherein FIG. 6A shows the manner in which magnetic moment of the storage layer changes with time and FIG. 6B shows the manner in which an x-axis direction component of magnetic moment of the storage layer changes with time;

FIGS. 7A and 7B are diagrams showing motions of magnetic moment obtained with application of an electric current pulse when magnetic moment of the storage layer is directed in the left-hand side, wherein FIG. 7A shows the manner in which magnetic moment of the storage layer changes with time and FIG. 7B shows the manner in which an x-axis direction component of magnetic moment of the storage layer changes with time;

DESCRIPTION OF THE PREFERRED EMBODIMENTS

Figure 1:
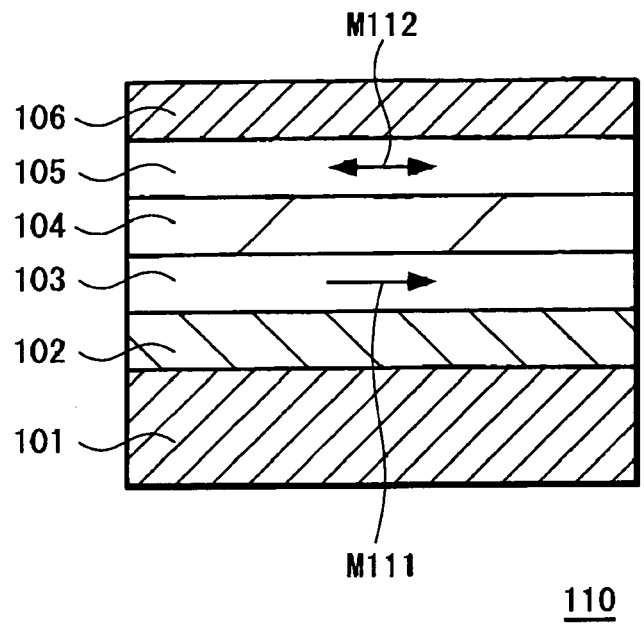
FIG. 1 is a schematic diagram (cross-sectional view) showing a general arrangement of a storage element capable of recording information by using spin transfer according to the related art.

Prior to the description of the preferred embodiments of the invention, the present invention will be outlined.

According to the present invention, the magnetization direction of a storage layer of a storage element is inverted with spin transfer (spin injection) thereby to record information. The storage layer is formed of a magnetic material such as a ferromagnetic layer and holds information with the magnetization state (magnetization direction) of the magnetic material.

In the fundamental operation to invert the magnetization direction of the magnetic layer with spin injection, an electric current of a magnitude larger than a certain threshold value is applied to a storage element composed of a giant magnetoresisitve effect element (GMR element) or a tunnel magnetoresistive effect element in the direction perpendicular to the film plane (laminating layer direction of each layer of the storage element).

According to the present invention, the storage layer further includes a drive layer of which magnetization direction is substantially fixed to the laminating layer direction, that is, a drive layer having a vertical magnetic anisotropy through a non-magnetic layer to thereby construct a storage element in a addition to the related-art storage layer and magnetization fixed layer (reference layer).

Then, recording of information, that is, operation to invert the magnetization direction of the storage layer is carried out by only supplying an electric current in the direction in which electrons are supplied from the drive layer to the storage layer and inversion of the polarity of the electric current to record information is not carried out.

Then, the magnetization direction of the storage layer can be controlled by changing a time period in which an electric current is supplied.

This principle will be described.

Since the drive layer has a vertical magnetic anisotropy, it has a magnetic anisotropy parallel to the laminating layer direction (z-axis direction) of each layer of the storage element.

When spin injection is carried out by supplying polarized electrons from the drive layer having this vertical magnetic anisotropy to the storage layer, precession motion around the z axis is excited in the magnetic moment of the storage layer.

Then, depending on a time when this precession motion is stopped, that is, a time when the supply of polarized electrons is stopped, the direction of the magnetization of the storage layer settled on the magnetization easy axis direction (x axis direction) becomes different.

Accordingly, when an electric current pulse is supplied to the storage element, it is possible to control by changing a pulse width (time) of an electric current pulse whether the magnetization direction of the storage layer should be inverted or not inverted.

It is desirable that the magnetization fixed layer (reference layer), the storage layer and the non-magnetic layer (intermediate layer) which separates the drive layer should be formed of a non-magnetic metal film such as CU having a long distance (spin diffusion length) by which spin needs to lose its polarizability information or a tunnel insulating film such as an Al oxide film.

When information is read out from the storage layer of the storage element, the magnetization fixed layer (reference layer), which becomes the standard of information, may be provided on the storage layer of the storage element through the tunnel insulating layer and information may be read out from the storage layer by a ferromagnetic tunnel electric current flowing through the tunnel insulating layer or by a magnetoresistive effect.

Also, it is desirable that a portion between the storage layer and the magnetization fixed layer (reference layer) should be formed as the tunnel insulating layer, the portion between the drive layer and the storage layer should be formed as the non-magnetic metal layer (non-magnetic conductive layer) and that an output signal of thus read-out information should be substantially determined by the storage layer and the magnetization fixed layer (reference layer).

Also, if a magnetic dumping constant of the storage layer is selected to be greater than 0.03, then the interval of the pulse width in which the magnetization direction of the storage layer is changed is increased so that a margin of information recording operation can be increased.

The above-mentioned recording method in which the change of the magnetization direction of the storage layer is controlled based on the duration of the time in which the pulse electric current is supplied is not a method in which specific information ("0" or "1") is not selectively overwritten. Therefore, a memory may include a circuit (so-called Write-after-Read circuit) for recording information after it has confirmed whether information recorded on the memory cell to be recorded (storage layer of storage element) is placed in either "0" state or "1" state.

When this circuit is in use, when the contents of information obtained before and after recording are the same and the magnetization direction of the storage layer need not be inverted, it becomes possible to stop the supply of a recording electric current so that power consumption can be decreased.

Subsequently, specific embodiments of the present invention will be described.

Figure 3:
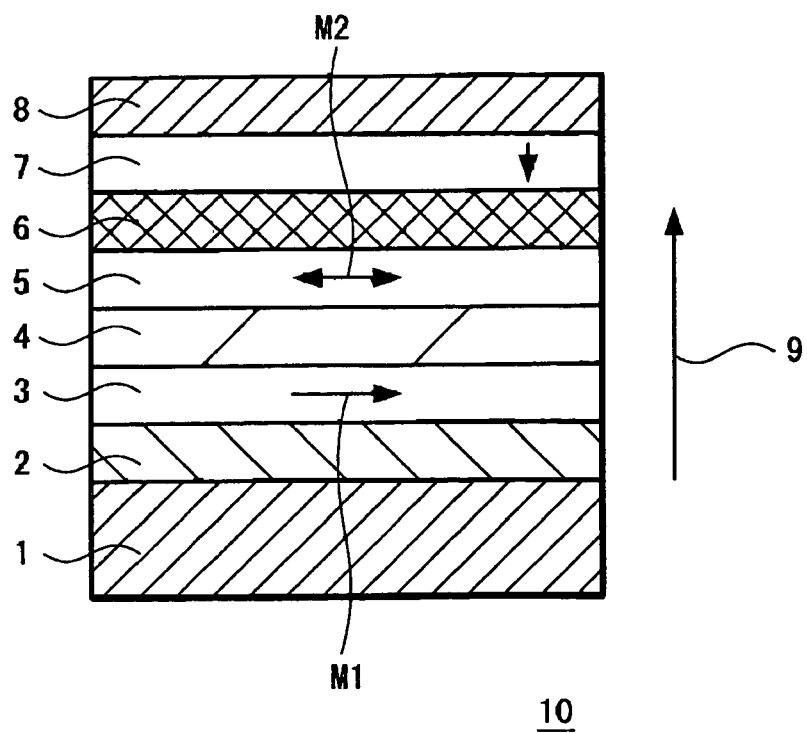
FIG. 3 is a schematic diagram (cross-sectional view) showing an arrangement of a storage element constructing a memory cell of a memory according to an embodiment of the present invention.

FIG. 3 is a schematic diagram (cross-sectional view) of an arrangement of a storage element composing a memory cell of a memory according to an embodiment of the present invention.

As shown in FIG. 3, this storage element 10 is composed of an underlayer 1, an antiferromagnetic layer 2, a magnetization fixed layer 3, a non-magnetic layer 4 and a storage layer 5, laminated with each other, in that order, from the lower layer.

The antiferromagnetic layer 2 is provided under the magnetization fixed layer 3 and the direction of a magnetization M1 of the magnetization fixed layer 3 is fixed by this antiferromagnetic layer 2. In FIG. 3, the direction of the magnetization M1 of the magnetization fixed layer 3 is fixed to the right hand side.

The storage layer 5 is adapted to store therein information based on the magnetization state, that is, the direction of the magnetization M2 of the storage layer 5. This storage layer 5 is able to store therein information based on whether the direction of the magnetization M2 is right-hand side or left-hand side.

Also, since the non-magnetic layer 4 is provided between the storage layer 5 and the magnetization fixed layer 3, the storage layer 5 and the magnetization fixed layer 3 constitute a GMR element or an MTJ element. Thus, it is possible to detect the direction of the magnetization M2 of the storage layer 5 by using the magnetoresistive effect.

Specifically, when the direction of the magnetization M2 of the storage layer 5 is in parallel to (right-hand side) to the direction (right-hand side) of the magnetization M1 of the magnetization fixed layer 3, electric resistance is lowered. When on the other hand they are in anti-parallel to each other, electric resistance is increased. Thus, it is possible to detect the direction of the magnetization M2 of the storage layer 5 by using the magnetoresistive effect.

The materials of the magnetization fixed layer 3 and the storage layer 5 are not limited in particular, and it is possible to use alloy material made of one kind or more than two kinds of iron, nickel and cobalt. Further, the materials of the magnetization fixed layer 3 and the storage layer 5 may contain transition metal elements such as Nb and Zr and light element such as B.

As the material of the antiferromagnetic material, there may be used alloy of metal elements such as iron, nickel, platinum, iridium and rhodium and manganese and oxide such as cobalt and nickel.

The non-magnetic layer 4 is formed of a non-magnetic conductive layer or an insulating layer such as a tunnel barrier layer. As the material of the non-magnetic conductive layer, there may be used ruthenium, copper, chromium, gold, silver and the like. As the material of the tunnel barrier layer, there may be used insulating materials such as aluminum oxide.

In this embodiment, in particular, the aforementioned drive layer 7 of which magnetization direction is substantially fixed to the laminating layer direction is provided on the storage layer 5 of the storage element 10 through the non-magnetic layer 6.

Specifically, as shown in FIG. 3, the non-magnetic layer 6, the drive layer 7 and the capping layer 8 are further laminated on the storage layer 5 and thereby the storage element 10 is constructed.

Also, in this embodiment, information is recorded on the storage layer 5 by supplying electrons to the storage element 10 in the direction from the capping layer 8 to the underlayer 1, that is, in the direction from the drive layer 7 to the storage layer 5 and the polarity of the electric current is not inverted for recording information. Then, the electric current supplying means such as electrodes, wirings and power supply is constructed in such a manner that electrons flow in such direction when information is recorded.

At that time, a recording electric current I is opposite to the direction in which electrons flow and it becomes the direction from the underlayer 1 to the capping layer 8 as shown by an arrow 9 in FIG. 3.

Further, information ("0" information or "1" information) to be recorded on the recording layer 5 is controlled based on a duration of time period in which an electric current is supplied from the electric current supplying means.

As a result, only one polarity of an electric current supplied from the electric current supplying means to the storage element 10 can be used and both of the NMOS transistor and the PMOS transistor need not be provided. It becomes sufficient to provide only one of the NMOS transistor and the PMOS transistor.

Figure 4:
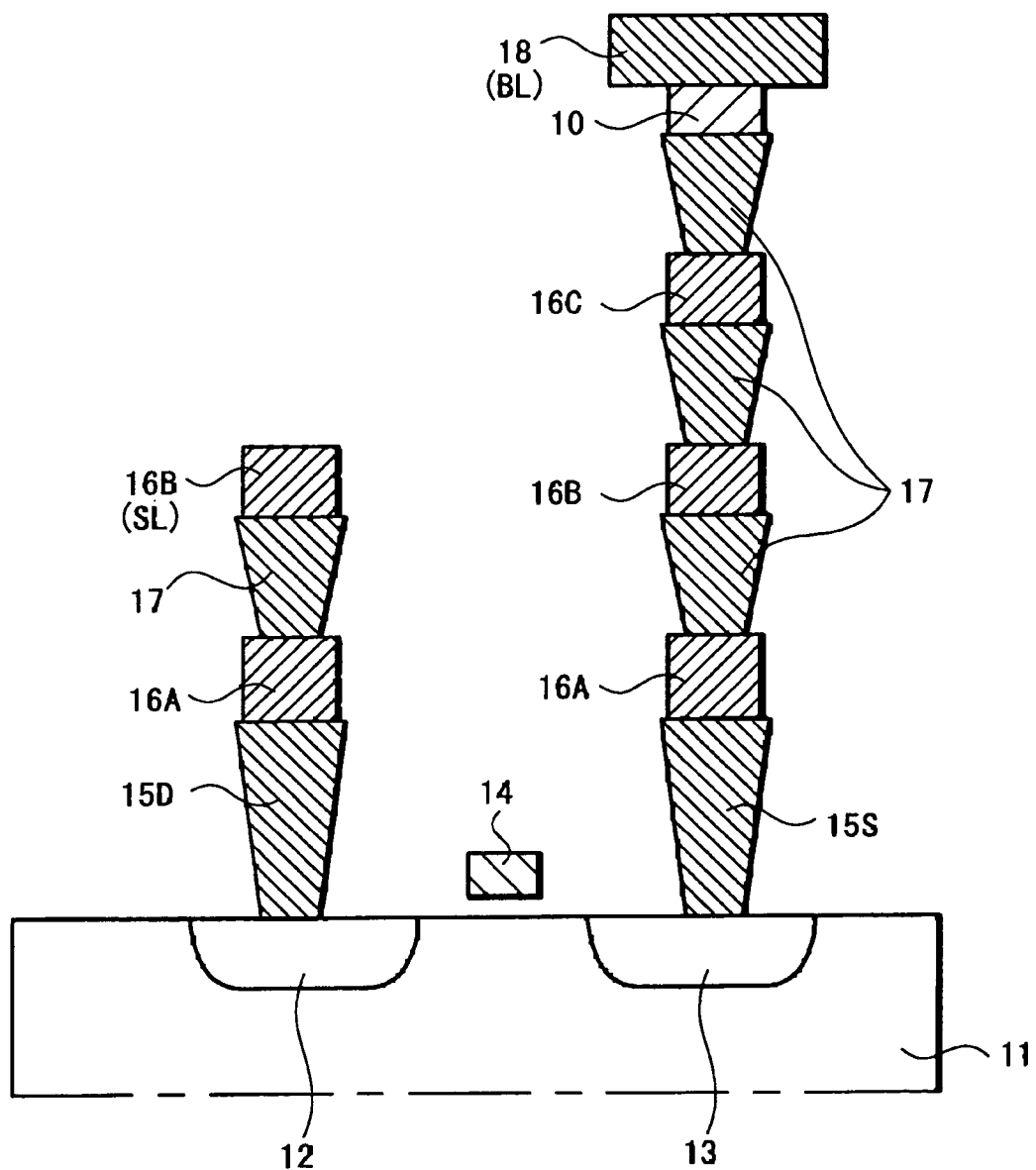
FIG. 4 is a cross-sectional view of one memory cell of a memory using the storage element shown in FIG. 3.

Next, FIG. 4 is a schematic diagram (cross-sectional view) of an arrangement of a memory according to this embodiment. FIG. 4 is a cross-sectional view showing one memory cell constructing a memory (storage apparatus).

In this memory, the memory cell is constructed by the storage element 10 shown in FIG. 3.

This storage element 10 includes the storage layer 5 capable of storing therein information based on the magnetization state, that is, the direction of the magnetization M2 as mentioned hereinbefore.

A drain region 12, a source region 13 and a gate electrode 14 constructing a selection transistor for selecting each memory cell are constructed on the semiconductor substrate 11 such as a silicon substrate.

Of these elements, the gate electrode 14 is connected to a word line WL (see FIG. 5) which lies on another cross-section of FIG. 4. The drain region 12 is connected to a sense line SL formed of an interconnection layer 16B of a second layer through a contact layer 15D, an interconnection layer 16A of a first layer and a buried metal layer 17. The source region 13 is connected through a contact layer 15S, the interconnection layer 16A of the first layer, the interconnection layer 16B of the second layer, an interconnection layer 16C of a third layer and the buried metal layer 17 among the respective interconnection layers 16A, 16B and 16C.

Then, the storage element 10 is connected to a bit line BL formed of an interconnection layer 18 of a fourth layer.

When the drain region 12 is made common to the selection transistors of the adjacent two memory cells, for example, it becomes possible to make the sense line SL become common to two memory cells.

Figure 5:
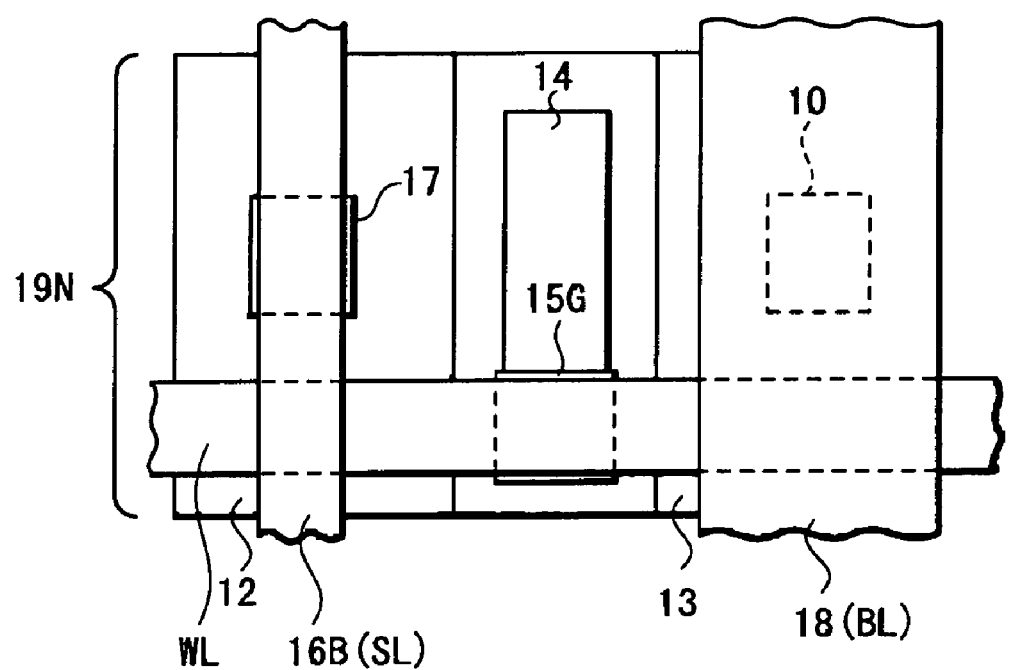
FIG. 5 is a top view of the memory cell shown in FIG. 4.

Subsequently, FIG. 5 is a top view of one memory cell of shown in FIG. 4.

As shown in FIG. 5, the selection transistor is constructed by only an NMOS transistor 19N.

Then, by this NMOS transistor 19N, the memory cell can be switched so that the electric current may be supplied to the storage element or that the supply of the electric current to the storage element 10 may be stopped.

The gate electrode 14 of the NMOS transistor 19N is connected to the word line WL through the contact layer 15G. A control signal (voltage) is supplied to the word line WL in response to ON and OFF of an electric current flowing through the storage element 10.

Since the memory according to this embodiment includes the arrangement of the memory cell shown in FIGS. 4 and 5, by supplying a potential difference to the bit line BL and the sense line S1 so that the voltage is applied to the word line WL to turn on the NMOS transistor 19N, it is possible to supply the electric current to one of the laminating layer directions of the storage element 10.

Then, as shown in FIG. 5, since the selection transistor is constructed by only the NMOS transistor 19N, as compared with the case in which the selection transistor is constructed by the two transistors 119N and 119P shown in FIGS. 2A and 2B, it becomes possible to considerably decrease the area of the memory cell.

With respect to the memory according to this embodiment, the storage element 10 shown in FIG. 3 was manufactured in actual practice and characteristics thereof were examined.

Figure 6A:
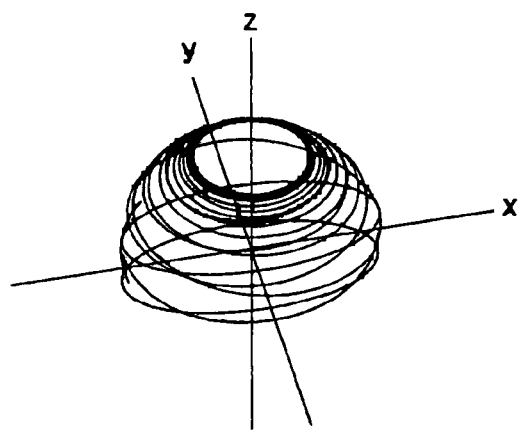
Figure 6B:
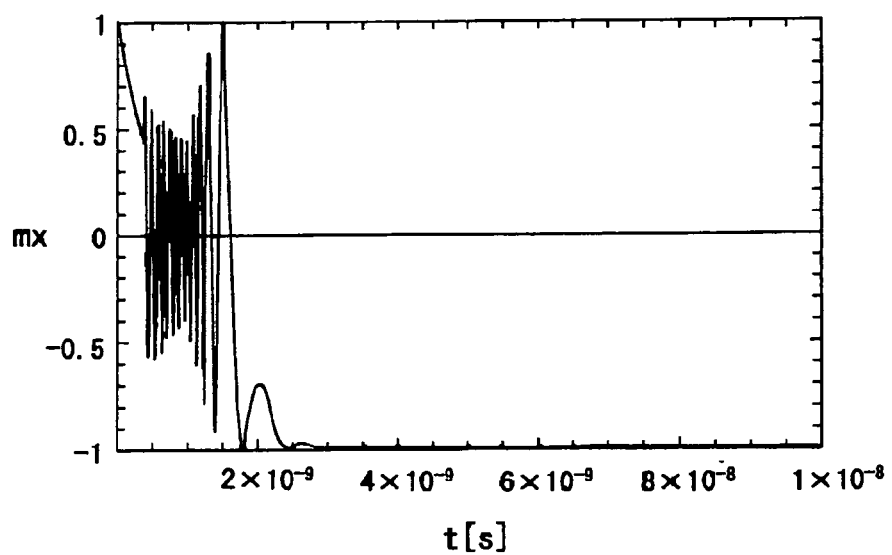

FIG. 6A is a diagram showing motions of a magnetic moment obtained when a pulse electric current of 1 ns (nanosecond; this unit will be similarly applied to the following description as well) and the supply of the electric current is stopped in the state in which the magnetic moment of the storage layer 5 of the storage element 10 shown in FIG. 3 is directed in the x axis direction (magnetization easy axis direction). FIG. 6B is a diagram showing a time change of an x-axis component mx of a magnetic moment of the storage layer.

Figure 7A:
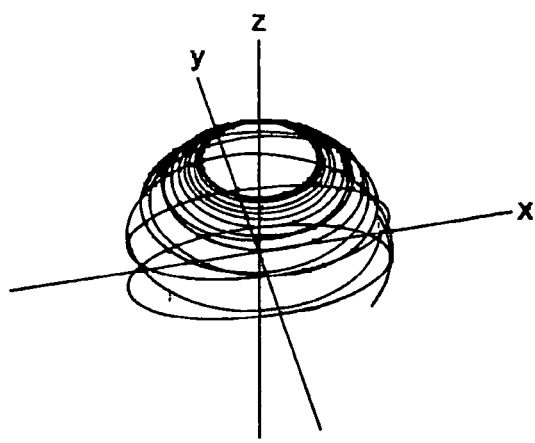
Figure 7B:
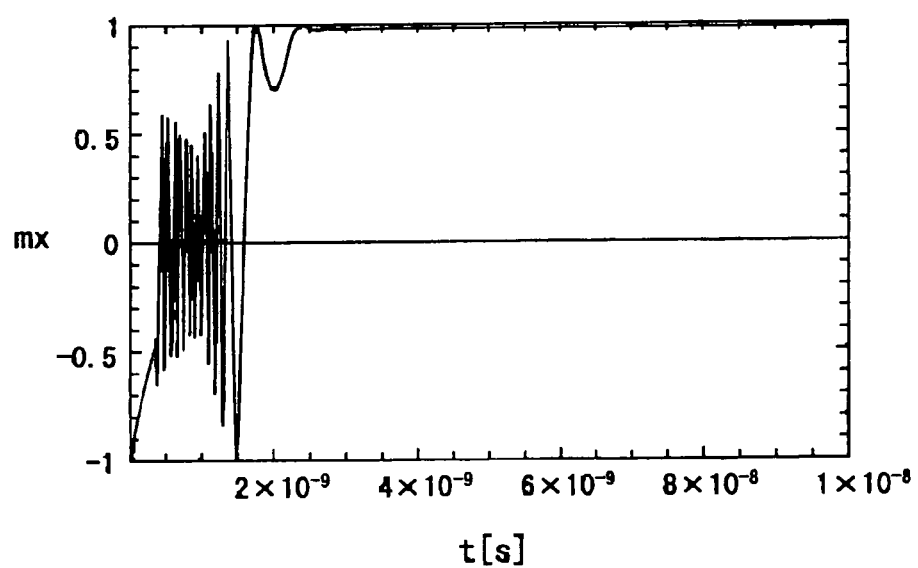

FIGS. 7A and 7B are diagrams showing motions of a magnetic moment obtained when a pulse electric current of 1 ns is applied and the supply of the electric current is then stopped similarly in the state in which the magnetic moment of the storage layer 5 is directed in the left-hand side of the x-axis direction conversely.

As described above, it was illustrated in which the magnetization of the storage layer was inverted from the right-hand side to the left-hand side and from the left-hand side to the right-hand side respectively by the pulse electric current of 1 ns.

Next, the direction of the magnetization M2 was examined after 100 ns while the pulse width (time) of the pulse electric current flowing through the storage element 10 was being changed.

The material of the storage layer 5 was selected to be a CoFeB alloy, its saturation magnetization was selected to be 1[T], a magnetic dumping constant was selected to be 0.01, a film thickness was selected to be 5 nm and the planar shape of the storage element 10 was selected to be ellipse whose minor axis was 0.1 μm and major axis was 0.2 μm.

Then, while an electric current I flowing through the storage element 10 is selected to be 600 μA and 650 μA, the change of the magnetization M2 of the storage layer 5 obtained after 100 ns by the pulse width,of the electric current pulse with respect to respective electric current amount was examined.

Figure 8A:
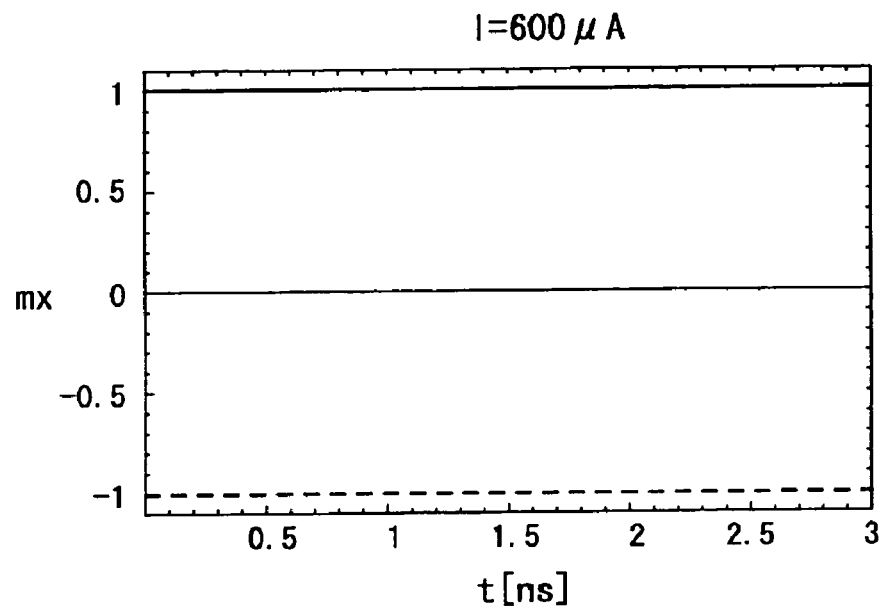
FIGS. 8A and 8B are diagrams showing the directions in which the magnetization of the storage layer is directed after 100 nanoseconds as a pulse width of an electric current pulse is changed, respectively.
Figure 8B:
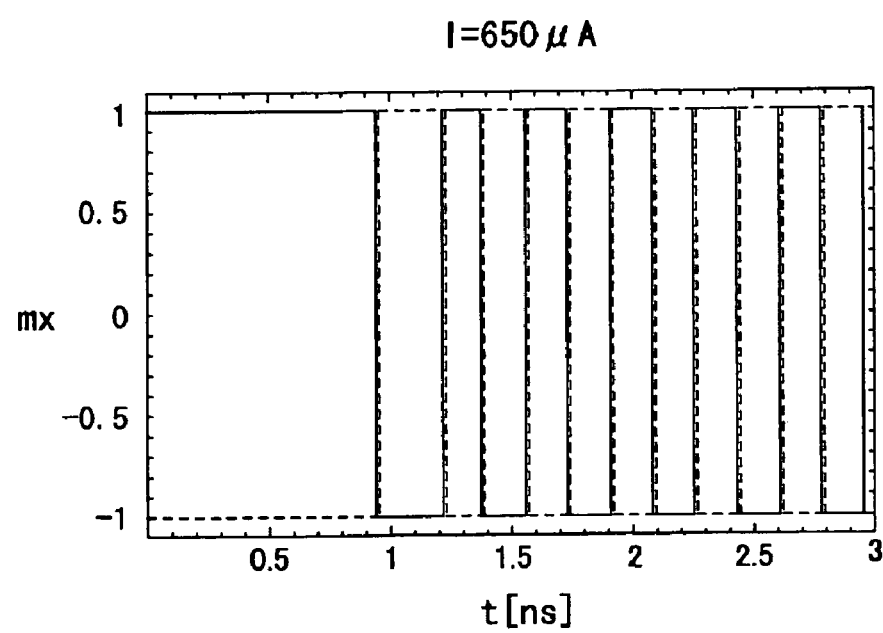

FIGS. 8A and 8B show examined results. FIG. 8A shows examined results obtained when the electric current I was selected to be 600 μm. FIG. 8B shows examined results obtained when the electric current I was selected to be 650 μA. A vertical axis mx in FIGS. 8A and 8B show the direction of the magnetization M2 of the storage layer 5. A solid line shows the case in which the magnetization of the initial state is in the right-hand side (mx=1) and a broken line shows the case in which the magnetization of the initial state is in the left-hand side (mx=−1), respectively.

As shown in FIG. 8A, in the case of the electric current I=600 μA, the direction of the magnetization M2 of the storage layer 5 is not changed independently of the pulse width of the pulse electric current.

On the other hand, as shown in FIG. 8B, in the case of the electric current I=650 μA, depending on the pulse width of the pulse electric current, the direction of the magnetization M2 of the storage layer 5 is not changed, inverted and returned to the same direction. For example, when the pulse width lies in a range of from 0 to 0.9 ns, the direction of the magnetization M2 is not changed, when the pulse width lies in a range of from 1 to 1.2 ns, the direction of the magnetization M2 is inverted, when the pulse width is at 1.3 ns, the direction of the magnetization M2 is returned to the original direction and when the pulse width is at 1.5 ns, the direction of the magnetization M2 is finally inverted from the original direction.

Specifically, when an electric current exceeding a threshold value existing between 600 μA and 650 μA is applied, the occurrence of inversion is changed substantially periodically depending on the time period in which the pulse electric current is supplied.

That is, in order to invert the direction of the magnetization, it is sufficient to set the conditions such that the pulse electric current of the pulse width may be supplied at a time T (for example, 1.5 ns) in which the inversion of the direction occurs in FIG. 8B. At that time, since the direction of the magnetization is inverted regardless of the case in which the initial state of the direction of the magnetization M2 of the storage layer 5 is right-hand side or left-hand side, it is not necessary to change the polarity of the electric current in response to the initial state.

According to the above-mentioned embodiment, since the drive layer 7 of which the magnetization direction is substantially fixed to the laminating layer direction of the storage element 10 and which has the vertical magnetic anisotropy is provided on the storage layer 5 of the storage element 10 through the non-magnetic layer 6, when the electric current flows through the laminating layer direction of the storage element 10, since polarized electrons between the drive layer 7 and the storage layer 5 are moved (spin injection), force of the laminating layer direction is given to the magnetization vector of the storage layer 5 so that the precession motion is generated in the magnetization vector of the storage layer 5, thereby resulting in the direction of the magnetization M2 of the storage layer 5 being changed.

Then, it becomes possible to effect control such that the magnetization direction may be inverted from the direction of the magnetization M2 obtained before the electric current flows or may not be inverted (magnetization direction may become the same direction obtained before the electric current flows) depending on the time period in which the electric current flows.

Accordingly, without changing the polarity of the electric current, it becomes possible to record "0" information and "1" information by changing the time period in which the electric current I of the same polarity flows through the storage element 10.

Therefore, when each cell includes the selection transistor, it becomes sufficient to provide one transistor through which an electric current of polarity can easily flow in response to the polarity of the electric current flowing through the storage element 10.

As described above, since the selection transistor is constructed by only the NMOS transistor 19N, as compared with the case in which the selection transistor is constructed by the two transistors, it becomes possible to simplify the arrangement of the memory cell and to decrease the size of the memory cell.

As a result, in the memory in which many memory cells constructing the storage elements 10 are constructed, it becomes possible to integrate the storage elements at high density. That is, it becomes easy to miniaturize the memory and to increase the storage capacity by increasing the density of the memory.

Therefore, according to the arrangement of this embodiment, it is possible to realize a high-density nonvolatile memory.

Next, other embodiment of the present invention will be described.

In this embodiment, a magnetic dumping constant $\alpha$ of the storage layer 5 of the storage element 10 constructing the memory cell is selected to be larger than 0.03 and a memory is constructed.

In order to increase the magnetic dumping constant $\alpha$ of the storage layer 5, there may be used a method of adding element having a large atomic weight such as Pt and Au or rare earth element to the storage layer or a method of laminating a layer containing these elements Pt, Au and the like to the storage layer and so on.

Other arrangements of the storage element 10 and the memory are similar to those of the preceding embodiment and therefore need not be described.

Influences exerted on the operation margin by the magnetic dumping constant $\alpha$ of the storage layer 5 were examined.

The magnetic dumping constant $\alpha$ of the storage layer 5 was selected to be 0.03 and the storage element 10 was manufactured in the state in which other conditions were selected to be similar to those of the storage element 10 of which measured results were shown in FIGS. 8A and 8B.

Then, while an electric current I flowing through the storage element 10 is selected to be 700 µA and 750 µA, the change of the magnetization M2 of the storage layer 5 obtained after 100 ns by the pulse width of the electric current pulse with respect to respective electric current amount was examined.

Figure 9A:
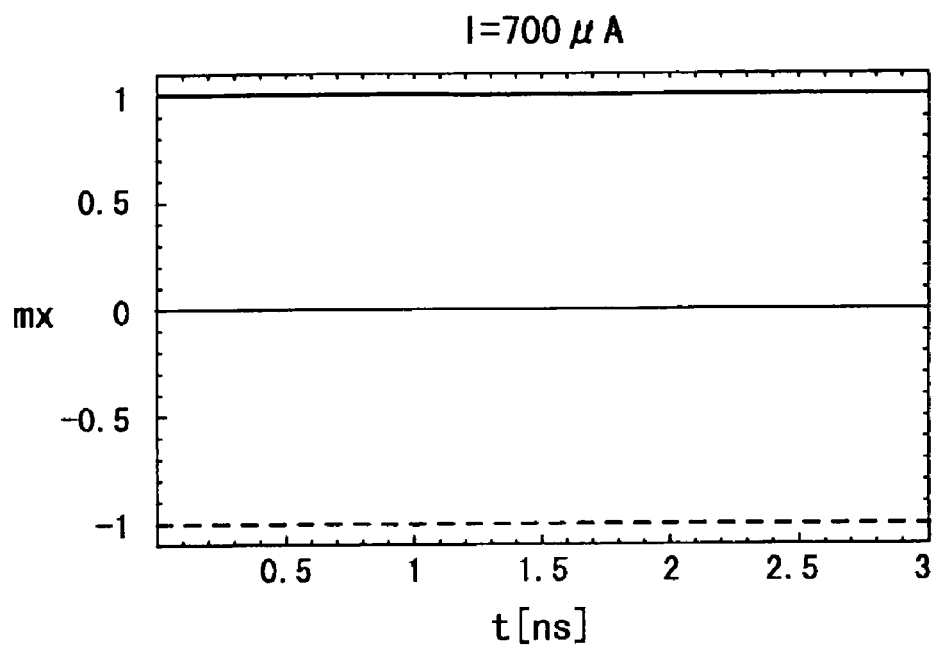
FIGS. 9A and 9B are diagrams showing the directions in which the magnetization of the storage layer is directed after 100 nanoseconds as a pulse width of an electric current pulse is changed when a magnetic damping constant of the storage layer is selected to be 0.03, respectively.
Figure 9B:
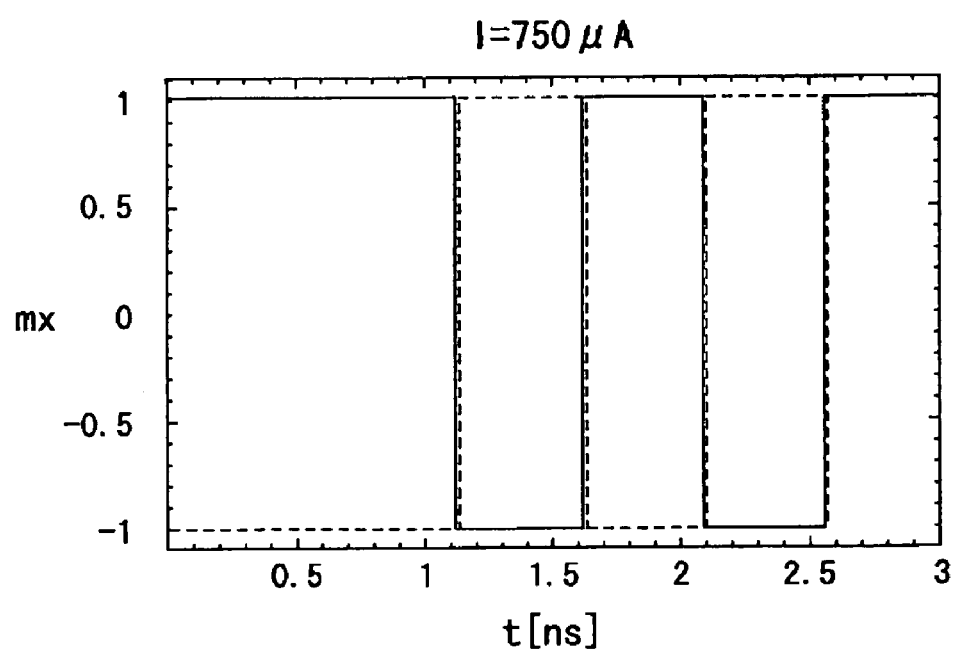

FIGS. 9A and 9B show examined results. FIG. 9A shows examined results obtained when the electric current I was selected to be 700 µA. FIG. 8B shows examined results obtained when the electric current I was selected to be 750 µA.

As shown in FIGS. 9A and 9B, when the magnetic dumping constant $\alpha$ is selected to be 0.03, as compared with the case in which the magnetic dumping constant $\alpha$ is selected to be 0.01 as shown in FIGS. 8A and 8B, although the electric current amount of the electric current pulse necessary for recording is slightly increased, since the interval of the pulse width required when the direction of the magnetization is changed is increased, it becomes possible to obtain a larger margin relative to fluctuations of the pulse width.

Therefore, according to this embodiment, since the magnetic dumping constant a of the storage layer 5 of the storage element 10 is selected to be larger than 0.03, a larger margin relative to the fluctuations of the pulse width can be obtained so that information can be recorded stably.

Figure 10:
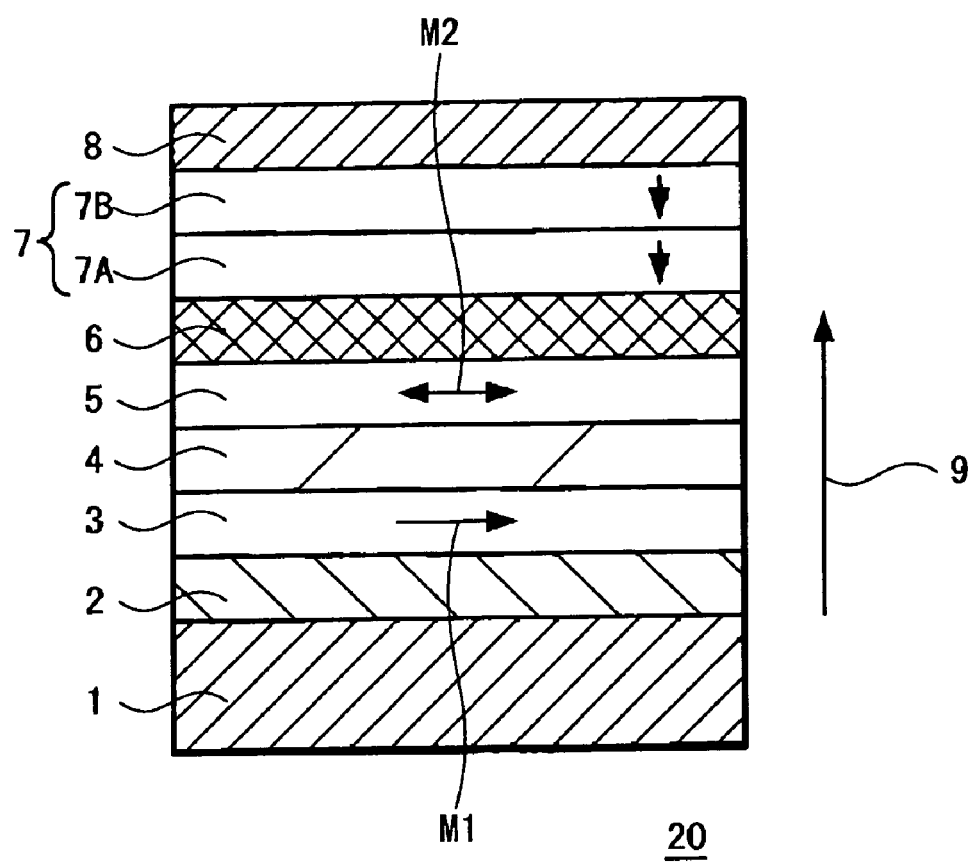
FIG. 10 is a schematic diagram (cross-sectional view) showing an arrangement of a storage element constructing a memory cell of a memory according to another embodiment of the present invention.

Next, FIG. 10 is a schematic diagram (cross-sectional view) of an arrangement of a memory element constructing a memory cell of a memory according to a further embodiment of the present invention.

In this embodiment, as shown in FIG. 10, the drive layer 7 has a laminated layer structure composed of two magnetic layers 7A and 7B and thereby a storage element 20 is constructed.

Of the two magnetic layers 7A and 7B, the magnetic layer 7A opposing the storage layer 5 is made of a material such as CoFe having a large spin polarizability and which can be supplied with an electric current having a high polarization degree in order to increase spin transfer efficiency. This magnetic layer 7A need not have a vertical magnetic anisotropy alone.

On the other hand, the magnetic layer 7B which does not oppose the storage layer 5 is made of FePt and Co/Pt multilayer film having a strong vertical anisotropy, rare earth alloy and the like. Thus, owing to mutual action of the magnetic layer 7B with respect to the magnetic layer 7A opposing to the storage layer 5, it is possible to enable the magnetic layer 7B to direct the magnetic moment of the magnetic layer 7A toward the laminating layer direction of the storage element 20.

As described above, since the two magnetic layers 7A and 7B constructing the drive layer 7 play their own roles, it becomes possible to increase a range in which materials of the drive layer 7 are to be selected. Thus, it becomes possible to record information at a low electric current which may not be realized by the single magnetic layer.

A rest of the arrangement is similar to that of the storage element 10 and the memory of the preceding embodiment. Therefore, identical elements and parts are denoted by identical reference numerals and need not be described.

According to the above-mentioned embodiment, the drive layer 7 of the storage layer 20 is composed of the laminated layer films of the two layers 7A and 7B, the layer 7A made of the material having the high polarizability is located on the drive layer at its side opposing the storage layer 5 and the layer 7B made of the material having the higher vertical magnetic anisotropy is located on the drive layer 7 at its side which does not oppose the storage layer 5.

Thus, it is possible to increase the spin transfer efficiency by the layer 7A made of the material having the high polarizability on the drive layer 7 at its side opposing the storage layer 5.

Also, by the layer 7B made of the material having the high vertical magnetic anisotropy located on the drive layer 7 at its side which does not oppose the storage layer 7, owing to mutual action of the magnetic layer 7B with respect to the magnetic layer 7A opposing to the storage layer 5, it is possible to enable the magnetic layer 7B to direct the magnetic moment of the magnetic layer 7A toward the laminating layer direction of the storage element 20.

As described above, since the two magnetic layers 7A and 7B constructing the drive layer 7 play their own roles, it becomes possible to increase a range in which materials of the drive layer 7 are to be selected.

Also, since the direction of the magnetization M2 of the storage layer 5 can be easily moved by using the mutual action between the two layers 7A and 7B, it becomes possible to record information at the electric current which may not be realized by the drive layer 7 of the single layer.

The layer arrangement of the storage element in the above-mentioned respective embodiments can be changed in a range in which it may play its essential role.

For example, the magnetization fixed layer may not be formed of the lamination layer of the antiferromagnetic layer and it may be made of a ferromagnetic material having a sufficiently large coercive force alone.

Also, the magnetic material layer constructing the storage layer and the magnetization fixed layer is not limited to the magnetic material layer of the single layer and it may have a laminating layer ferri structure in which more than two magnetic material layers having different compositions may be directly laminated with each other or in which more than two magnetic material layers may be laminated with each other through the non-magnetic layer.

In addition, the laminating layer order of respective layers and the arrangement of the layer arrangement and the direction of the electric current can be made different from those of the above-mentioned embodiments.

According to the present invention, it is sufficient that at least the drive layer of which magnetization direction is substantially fixed to the laminating layer direction may be provided on the storage layer, thereby resulting in the storage element being constructed.

According to the above-mentioned present invention, it becomes possible to record "0" information and "1" information on the storage layer of the storage element by changing a duration of time in which the electric current of the same polarity flows without changing the polarity of the electric current. Therefore, when each memory cell includes the selection transistor, it becomes sufficient to provide only one transistor through which an electric current of a polarity can flow in response to the polarity of the electric current flowing through the storage element.

As a result, since the selection transistor is composed of only the single transistor (for example, NMOS transistor), as compared with the memory in which the transfer gate consisting of the two transistors is constructed as the selection transistor, the arrangement of the memory cell can be simplified and also the size of the memory cell can be reduced.

Thus, it becomes possible to integrate storage elements at high density in the memory in which many memory cells composed of storage elements are constructed. That is, it becomes possible microminiaturize the memory and also it becomes possible to increase the storage capacity by increasing the density of the memory.

Therefore, according to the present invention, it is possible to realize the nonvolatile memory of high density.

It should be understood by those skilled in the art that various modifications, combinations, sub-combinations and alterations may occur depending on design requirements and other factors insofar as they are within the scope of the appended claims or the equivalents thereof.

What is claimed is:

1. An information storage element comprising:
    a storage layer comprising a magnetic material, wherein the magnetization of the storage layer changes when an electric current in a laminated layer direction is applied to the storage layer;
    a magnetization fixed layer;
    an intermediate layer between the storage layer and the magnetization fixed layer,
    a drive layer, the magnetic direction of the drive layer being substantially fixed to the laminated layer direction; and
    a non-magnetic layer between the drive layer and the storage layer.

2. A storage element according to claim 1, wherein said intermediate layer is a tunnel insulating layer and said nonmagnetic layer is a nonmagnetic conductive layer.

3. An information storage element, comprising:
    a storage layer comprising a magnetic material, wherein the magnetization of the storage layer changes when an electric current in a laminated layer direction is applied to the storage layer;
    a magnetization fixed layer;
    an intermediate layer between the storage layer and the magnetization fixed layer;
    a drive layer, the magnetic direction of the drive layer being substantially fixed to the laminated layer direction; and
    a non-magnetic layer between the drive layer and the storage layer wherein,
    said drive layer is comprises a first magnetic layer and a second magnetic layer, wherein,
        the first magnetic layer comnrises a material with a high spin polarizability and is between the storage layer and the second magnetic layer; and
        the second magnetic layer comprises a material with a large vertical.

4. A memory comprising:
    (a) a storage element comprising:
        a storage layer comprising a magnetic material, wherein the magnetization of the storage layer changes when an electric current in a laminated layer direction is applied to the storage layer;
        a magnetization fixed layer;
        an intermediate layer between the storage layer and the magnetization fixed layer;
        a drive layer, the magnetic direction of the drive layer being substantially fixed to the laminated layer direction;
        a non-magnetic layer between the drive layer and the storage layer; and
    (b) electric current supplying means for applying an electric current to said storage element along said laminated layer direction, wherein contents of information to be recorded are changed a duration of time in which an electric current is supplied from said electric current supplying means to said storage element.

5. A memory according to claim 4, wherein said electric current applied from said electric current supplying means to said storage element has only one polarity when information is recorded.

* * * * *